US005567483A

United States Patent [19]
Foster et al.

[11] Patent Number: 5,567,483
[45] Date of Patent: Oct. 22, 1996

[54] PROCESS FOR PLASMA ENHANCED ANNEAL OF TITANIUM NITRIDE

[75] Inventors: Robert F. Foster, Phoenix; Joseph T. Hillman, Scottsdale; Rikhit Arora, Mesa, all of Ariz.

[73] Assignees: Sony Corporation, Tokyo, Japan; Materials Research Corporation, Park Ridge, N.J.

[21] Appl. No.: 461,665

[22] Filed: Jun. 5, 1995

[51] Int. Cl.$^6$ ....................................................... H05H 1/00
[52] U.S. Cl. ...................... 427/535; 427/248.1; 427/294; 427/569
[58] Field of Search ...................................... 427/535, 569, 427/536, 248.1, 573, 294

[56] References Cited

U.S. PATENT DOCUMENTS

| | | | |
|---|---|---|---|
| 4,701,349 | 10/1987 | Koyanagi et al. | 427/228 |
| 4,792,378 | 12/1988 | Rose et al. | 156/643 |
| 4,897,709 | 1/1990 | Yokoyama et al. | 199/269 |
| 4,987,102 | 1/1991 | Nguyen et al. | 437/238 |
| 5,052,339 | 10/1991 | Vakerlis et al. | 118/723 |
| 5,246,881 | 9/1993 | Sandhu et al. | 437/192 |
| 5,296,404 | 3/1994 | Akahori et al. | 437/173 |
| 5,342,652 | 8/1994 | Foster et al. | 427/253 |
| 5,356,476 | 10/1994 | Foster et al. | 118/725 |
| 5,370,739 | 12/1994 | Foster et al. | 118/725 |
| 5,378,501 | 1/1995 | Foster et al. | 427/255 |
| 5,416,045 | 5/1995 | Kauffman et al. | 437/174 |
| 5,434,110 | 7/1995 | Foster et al. | 437/245 |
| 5,443,647 | 8/1995 | Aucoin et al. | 118/723 |

OTHER PUBLICATIONS

Hilton, M. R., et al., *Composition, Morphology and Mechanical Properties of Plasma–Assisted Chemically Vapor–Deposited TiN Films on M2 Tool Steel*, Thin Solid Films, 139 (1986) pp. 247–260. (No month available).

*Primary Examiner*—Bernard Pianalto
*Attorney, Agent, or Firm*—Wood, Herron & Evans, P.L.L.

[57] ABSTRACT

A titanium nitride film is annealed at a temperature less than 500° C. by subjecting said titanium nitride film to an RF created plasma generated from a nitrogen-containing gas in a rotating susceptor reactor. The formed film is comparable to a thin film annealed at significantly higher temperatures, making this process useful for integrated circuits containing aluminum elements.

9 Claims, 1 Drawing Sheet

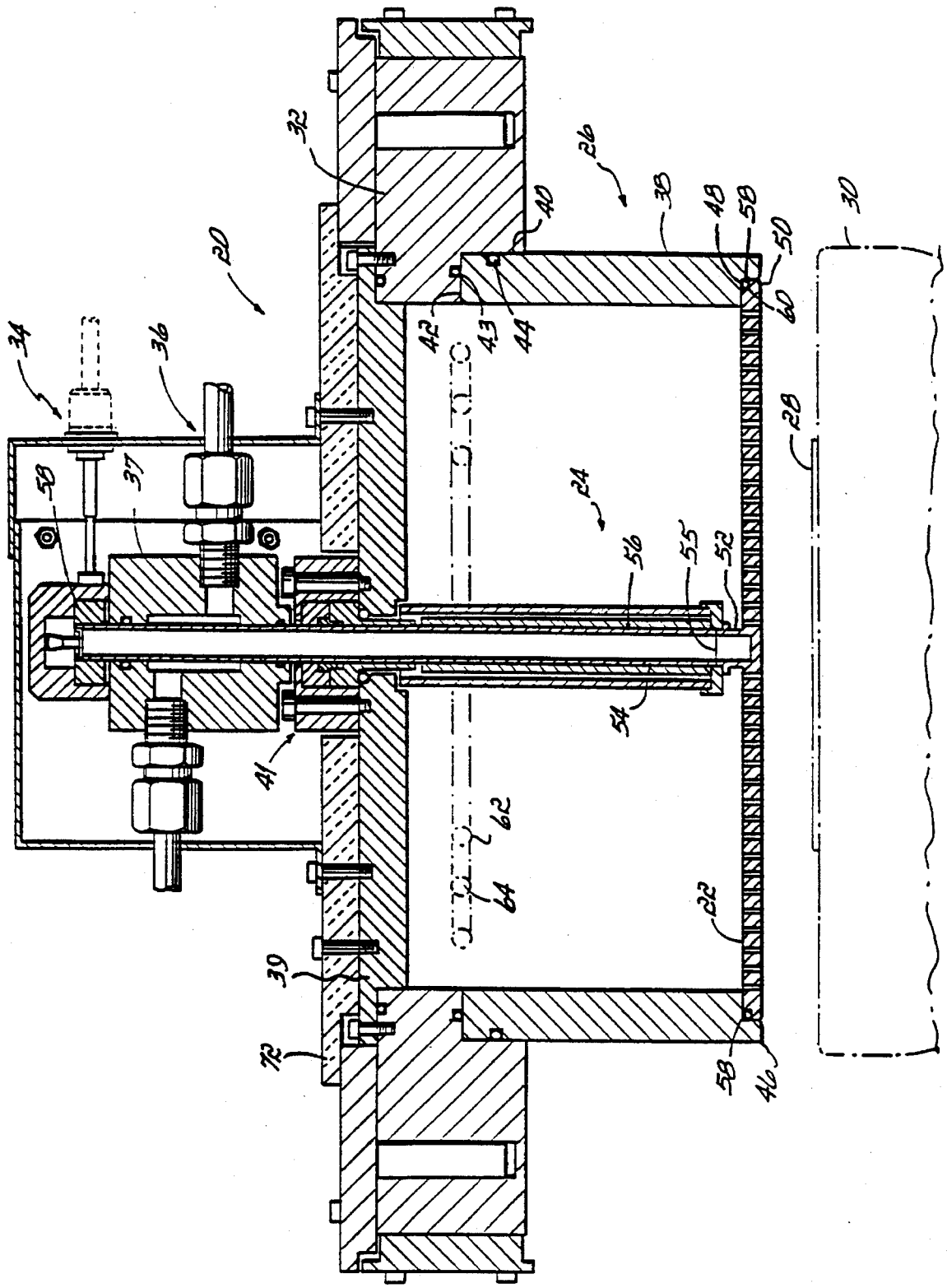

PROCESS FOR PLASMA ENHANCED ANNEAL OF TITANIUM NITRIDE

BACKGROUND OF THE INVENTION

In the formation of integrated circuits, thin films containing metal elements are often deposited on the surface of a substrate. These thin films provide conducting and ohmic contacts in the circuits and between the various devices of an integrated circuit. For example, a desired thin film might be applied to the exposed surface of a contact or a via on a semiconductor wafer with the film passing through the insulative layers on the wafer to provide plugs of conductive material for the purpose of making interconnections across the insulating layers. There are a number of different conductors and insulators which are chosen for various purposes in an integrated circuit. These may include titanium, titanium nitride, titanium tungsten alloys, tungsten, aluminum, silicon dioxide, as well as many others.

Titanium nitride is used in a variety of applications for integrated circuit fabrication. It is used as an adhesion layer for tungsten films, as a total interconnect and as a diffusion barrier. As an adhesion layer, titanium nitride offers advantages and applications where blanket tungsten is used for contact hole and via filling. The process is normally started by depositing a thin layer of a material that acts to improve adhesion between the tungsten and the underlying dielectric. Since tungsten adheres poorly to dielectric materials, a material must be used which adheres well to the dielectric and then adheres well to the tungsten. There are several materials that are suitable, but titanium nitride has several advantageous properties such as very low resistivity and a resistance to the chemistries used to etch tungsten, as well as exhibiting good adhesion to both dielectric and tungsten films.

As a barrier layer, titanium nitride also offers advantages as it serves as an impermeable barrier to silicon. It also has an activation energy higher than other materials. For example, the activation energy for copper diffusion into titanium nitride is reported to be 4.3 eV, while the activation energy from copper into most metals is on the order of 1-2 eV. There are several different methods typically used to form a layer of titanium nitride. These can include evaporation of titanium in a nitrogen atmosphere, reactive sputtering of titanium in a nitrogen/argon mixture, sputtering titanium nitride from a target in an argon atmosphere, depositing titanium and then converting it to titanium nitride in a subsequent nitridation step, or thermal chemical vapor deposition reactions employing titanium tetrachloride and ammonia.

There are many unique concerns with each of these different methods, particularly exposure to high temperatures normally related to traditional thermal chemical vapor deposition processes. At the device level of an integrated circuit, there are shallow diffusions of semi-conductor dopants which form the junctions of the electrical devices within the integrated circuits. The dopants are initially defused using heat during the diffusion step. The dopants will continue to diffuse when the integrated circuit is subjected to high temperatures during chemical vapor deposition. Temperature limitations may become even more severe if thermal chemical vapor deposition is performed after metal interconnection or wiring has been applied to the inner integrated circuit. For example, many integrated circuits utilize aluminum as an interconnection metal. However, various undesirable voids and extrusions occur in aluminum when it is subjected to high temperatures. Therefore, once interconnecting aluminum has been deposited onto an integrated circuit, the maximum temperature to which it can be exposed is approximately 500° C. and the preferred upper temperature limit is 400° C.

Two pending applications, Ser. Nos. 08/253,366 and 08/263,393, both entitled "Method and Apparatus for Producing Thin Films By Low Temperature Plasma-Enhanced Chemical Vapor Deposition Using a Rotating Susceptor Reactor" and both filed Jun. 3, 1994, describe methods and apparatuses for producing thin films by low temperature plasma enhanced chemical vapor deposition using a rotating susceptor reactor suitable to apply by chemical vapor deposition techniques a thin layer of titanium nitride. Titanium nitride, however, frequently needs further post-treatment in order to be suitable for further use.

SUMMARY OF THE INVENTION

It is the goal of the present invention to provide a low-temperature process which is compatible with aluminum already present on a wafer to establish a high-quality titanium nitride film comparable in properties to titanium nitride films deposited at very high temperatures. It is further an object of the present invention to provide a chemical vapor deposition process which provides for the annealing of titanium nitride films at temperatures below 500° C.

In accordance with the present invention, a titanium nitride film is annealed with a plasma created from a nitrogen-containing gas in a rotating susceptor reactor at a temperature less than 500° C. More particularly, the present invention provides a method of annealing titanium nitride films with an RF generated plasma formed from a nitrogen-containing gas such as ammonia at temperatures significantly less than 500° C. This method provides for a film having relatively low resistivity and relatively low chlorine content compared to films annealed at higher temperatures.

The objects and advantages of the present invention will be further appreciated in light of the following detailed description and drawing in which:

BRIEF DESCRIPTION OF THE DRAWINGS

The FIGURE is a diagrammatic, cross-sectional view of a reactor for use in the present invention.

DETAILED DESCRIPTION

The present invention can be used on a variety of different substrates having a deposited titanium nitride film. The titanium nitride film can be deposited by any of a variety of different techniques and methods including evaporation of titanium in a nitrogen ambient, reactive sputtering of titanium in a nitrogen argon atmosphere, sputtering titanium nitride from a target, or by thermal chemical vapor deposition reactions employing titanium tetrachloride and ammonia or nitrogen. Preferred methods of forming the titanium nitride film are disclosed more particularly in two other applications, both entitled, "Method and Apparatus for Producing Thin Films By Low Temperature Plasma-Enhanced Chemical Vapor Deposition Using a Rotating Susceptor Reactor," Ser. Nos. 08/253,366 and 08/253,393, both filed Jun. 3, 1994, incorporated herein by reference.

An apparatus suitable for plasma enhanced chemical vapor deposition is shown in the FIGURE. The FIGURE shows an RF showerhead/electrode configuration which can be utilized to practice the present invention. The chemical vapor deposition (CVD) apparatus 20 includes an RF showerhead/electrode 22 biased by an RF feedline assembly 24. Plasma and reactant gases are pumped through a cylinder assembly 26 to a substrate 28 on susceptor 30. Apparatus 20 includes a housing having a housing cover 32 and includes an RF supply assembly 34, a heat pipe assembly 36 with cooling jacket 37 and associated fluid supply lines and a gas distributor cover 39 with a sealing assembly 41. A cylinder 38 made of an insulating material such as quartz surrounds the RF feed line assembly 24.

Cylinder 38 is preferably formulated out of a high quality quartz such as Quartz T08-E available from Hereaus Amersil. Quartz cylinder 38 is supported by a showerhead/electrode 22, made of a conductive metal such as Nickel-200. An annular bore 40 is formed within housing cover 32 to receive an upper end 42 of cylinder 38. O-rings 43, 44 at the interface between stepped bore 40 and cylinder 38 form a seal at the interface. At the lower end 46 of cylinder 38, an annular notch 48 in cylinder 38 receives a peripheral edge 50 of the showerhead/electrode 22. The notch 48 of cylinder 38 rests upon the peripheral edge 50 of showerhead/electrode 22. Showerhead/electrode 22 includes a stem 52 attached to RF line tubing 54, such as by a weld at 55, to form a unitary RF line 56. RF line 56 is frictionally held and supported at its top end by collar 58. The RF line, in turn, supports showerhead/electrode 22 above susceptor 30. Showerhead/electrode 22, in turn, supports the cylinder 38 within the cylinder assembly 26 by abutting against cylinder 38 at notch 48 and holding it in bore 40. The interface between showerhead/electrode peripheral edge 50 and cylinder notch 48 is sealed by a compressed O-ring 58 which is compressed between shelf 48 and a similar corresponding annular notch 60 formed in peripheral edge 50 of the showerhead/electrode 22. A plurality of gas halos or rings 62, 64 introduce reactant gases into cylinder 38.

Generally, the substrate 28 is spaced from about 0.25 to 4 inches from the showerhead/electrode 22. The distance should be such that active ions strike the substrate.

In general, reaction gases are introduced through rings 62 and 64. These pass through cylinder 38 and a plasma is generated as the gases pass through the showerhead/electrode 22. The plasma will strike the substrate 28.

Titanium nitride can be thermally deposited upon a substrate wafer with this apparatus or other well known apparatus at approximately a temperature of 450° C. For example, a layer of titanium nitride can be deposited using $TiCl_4$ ammonia gas ($NH_3$) and nitrogen gas ($N_2$). There are other known methods and parameters for depositing a TiN film.

The titanium nitride film is subjected to a plasma-enhanced anneal by creating a plasma from a nitrogen-containing gas such as nitrogen or ammonia, preferably using radio frequency energy, using an apparatus such as that shown in the FIGURE. In order to conduct the plasma-enhanced anneal, the susceptor temperature should be in the range from about 400° C. to about 500° C. with the reactor pressure maintained at from about 0.5 to about 10 torr, preferably 5 torr. The nitrogen-containing gas can either be ammonia or nitrogen with ammonia being preferred. The flow rate can vary relatively widely. Generally, the flow rate will be from about 1,000 to about 10,000 sccm, with about 5,000 being preferred. It is preferred to rotate susceptor 30 to improve uniformity of the plasma over the titanium nitride film. 100 rpm is adequate although a higher rotation rate may be employed.

The RF electrode power must be sufficient to establish a plasma, but does not have to be significantly higher. Accordingly, the RF power can range from at least about 100 W, with the upper limit generally being the power at which the semiconductor is destroyed. The invention works well at frequencies ranging from 450 KHz or less up to well in excess of 26 MHz.

The anneal is continued for a period of time of 15 to about 300 seconds or more with about 60 seconds generally being considered adequate.

In order to test the quality of the present invention, a titanium nitride film was deposited by thermal chemical vapor deposition using titanium tetrachloride ammonia and nitrogen as the reacting gases. The reaction conditions are given in Table 1.

TABLE No. 1

| | |
|---|---|
| $TiCl_4$ (SCCM) | 10 |
| $NH_3$ (SCCM) | 100 |
| $N_2$ (SCCM) | 5000 |
| REACTION CHAMBER PRESSURE (TORR) | 20 |
| SUSCEPTOR ROTATION RATE (RPM) | 100 |
| SUBSTRATE TEMP. (°C.) | 450 |

This was then annealed with a plasma anneal. The ammonia flow rate was 5,000 sccm, RF power setting 750 watts at KHz, pressure 5 torr, and rotation rate 100 rpm for 120 seconds. The susceptor temperature was maintained at 467° C., providing a wafer temperature of 450° C., which produced a film having a resistivity of 363 micro ohm-centimeters and a chlorine content of 4.5%. A similar film thermally annealed under the conditions set forth in Table 2 produced a film having a resistivity of over 1,000 micro-ohm centimeters and a chlorine content of 5.0%.

TABLE No. 2

| | |
|---|---|
| $NH_3$ (SCCM) | 5000 |
| REACTION CHAMBER PRESSURE (TORR) | 20 |
| SUSCEPTOR ROTATION RATE (RPM) | 100 |
| SUBSTRATE TEMP. (°C.) | 450 |
| (NO PLASMA) | |

The resistivity of films annealed in this manner generally exceed 1000 $\mu\Omega$-cm with chlorine contents of at least 5.0%.

Thus, by employing the present invention, an improved film is formed which has a resistivity lower than thermally annealed films and a chlorine content less than thermally annealed films. At the same time, the temperature is maintained at less than 500° C. which makes this suitable for integrated circuits having aluminum layers, improving the ability of the chemical vapor deposited titanium nitride films to be employed in integrated circuits. This significantly improves the overall utility of chemical vapor deposited titanium nitride films.

This invention has been described including the preferred method of practicing the invention currently known. However, the invention should only be defined by the appended claims wherein we claim:

1. A method of annealing a titanium nitride film on a substrate comprising contacting a titanium nitride film on a substrate with a plasma formed from a gas selected from the group consisting of ammonia and nitrogen at a temperature less than about 500° C.

2. The method claimed in claim 1 wherein said plasma is created by subjecting said gas to RF energy.

3. The method claimed in claim 2 wherein said RF energy greater than about 100 W.

4. The method claimed in claim 1 wherein said plasma is continued for about 15 to about 300 seconds.

5. The method claimed in claim 1 wherein said titanium nitride film is rotated at a rate from about 0 to about 1,000 rpm.

6. The method claimed in claim 1 wherein said temperature is from about 400° C. to about 500° C.

7. The method claimed in claim 1 wherein said plasma is conducted at a pressure of from about 1 to about 10 torr.

8. The method claimed in claim 1 wherein said titanium nitride film is a titanium nitride thin film.

9. A method of annealing a titanium nitride film on a substrate comprising contacting a rotating titanium nitride film on a substrate with an ammonia plasma formed by contacting a flowing stream of ammonia with an RF electrode at a wattage of at least about 100 W, wherein said film is heated to a temperature of 400° C. to about 500° C. at a pressure from about 1 to about 10 torr.

* * * * *